US011236021B2

United States Patent
She et al.

(10) Patent No.: US 11,236,021 B2
(45) Date of Patent: Feb. 1, 2022

(54) MITIGATING PYROPHORIC DEPOSITS IN EXHAUST PIPING DURING SIC CVI/CVD PROCESSES BY INTRODUCING WATER VAPOR INTO AN OUTLET PORTION OF A REACTION CHAMBER

(71) Applicant: GOODRICH CORPORATION, Charlotte, NC (US)

(72) Inventors: Ying She, East Hartford, CT (US); Naveen Menon, Anaheim, CA (US); Gavin Charles Richards, Windsor, CT (US); Zissis A. Dardas, Worcester, MA (US); Thomas P. Filburn, Granby, CT (US)

(73) Assignee: Goodrich Corporation, Charlotte, NC (US)

( * ) Notice: Subject to any disclaimer, the term of this patent is extended or adjusted under 35 U.S.C. 154(b) by 335 days.

(21) Appl. No.: 15/852,835

(22) Filed: Dec. 22, 2017

(65) Prior Publication Data

US 2019/0194806 A1 Jun. 27, 2019

(51) Int. Cl.
*C23C 16/455* (2006.01)
*C23C 16/44* (2006.01)
(Continued)

(52) U.S. Cl.
CPC ............ *C04B 35/80* (2013.01); *C04B 35/565* (2013.01); *C23C 16/045* (2013.01);
(Continued)

(58) Field of Classification Search
CPC .......... C23C 16/45517; C23C 16/4412; C23C 16/325; C23C 16/045; C04B 35/806;
(Continued)

(56) References Cited

U.S. PATENT DOCUMENTS

| 4,823,734 | A | 4/1989 | Christin |
| 5,738,908 | A | 4/1998 | Rey et al. |

(Continued)

FOREIGN PATENT DOCUMENTS

EP 3231890 10/2017

OTHER PUBLICATIONS

European Patent Office, European Search Report dated May 9, 2019 in Application No. 18214522.7.

*Primary Examiner* — Michael B Cleveland
*Assistant Examiner* — Michael G Miller
(74) *Attorney, Agent, or Firm* — Snell & Wilmer L.L.P.

(57) ABSTRACT

Systems for and methods of manufacturing a ceramic matrix composite include introducing a gaseous precursor into an inlet portion of a reaction furnace having a chamber comprising the inlet portion and an outlet portion that is downstream of the inlet portion, and delivering a mitigation agent, such as water vapor or ammonia, into an exhaust conduit in fluid communication with and downstream of the outlet portion of the reaction chamber so as to control chemical reactions occurring with the exhaust chamber. Introducing the gaseous precursor densities a porous preform, and introducing the mitigation agent shifts the reaction equilibrium to disfavor the formation of harmful and/or pyrophoric byproduct deposits within the exhaust conduit.

11 Claims, 5 Drawing Sheets

(51) Int. Cl.
*C23C 16/32* (2006.01)
*C23C 16/04* (2006.01)
*C04B 35/80* (2006.01)
*C04B 35/565* (2006.01)

(52) U.S. Cl.
CPC ........ *C23C 16/325* (2013.01); *C23C 16/4412* (2013.01); *C23C 16/45517* (2013.01); *C04B 2235/46* (2013.01); *C04B 2235/5244* (2013.01); *C04B 2235/5248* (2013.01); *C04B 2235/614* (2013.01)

(58) Field of Classification Search
CPC .......... C04B 35/565; C04B 2235/5248; C04B 2235/46; C04B 2235/5244; C04B 2235/614
USPC .................... 118/715–733; 427/248.1–255.7
See application file for complete search history.

(56) References Cited

U.S. PATENT DOCUMENTS

| | | |
|---|---|---|
| 6,780,462 B2 | 8/2004 | Purdy et al. |
| 7,335,397 B2 | 2/2008 | Rudolph et al. |
| 7,351,390 B2 | 4/2008 | Loncle et al. |
| 8,105,649 B1 | 1/2012 | Wedding et al. |
| 9,376,749 B2 | 6/2016 | Hegermann et al. |
| 2006/0269665 A1* | 11/2006 | Rudolph ................. C04B 35/83 427/248.1 |
| 2011/0020544 A1* | 1/2011 | Matsumoto ......... C23C 16/4412 427/248.1 |
| 2011/0135552 A1* | 6/2011 | Dickinson .............. B01D 53/32 423/235 |
| 2015/0314233 A1 | 11/2015 | Hur et al. |

* cited by examiner

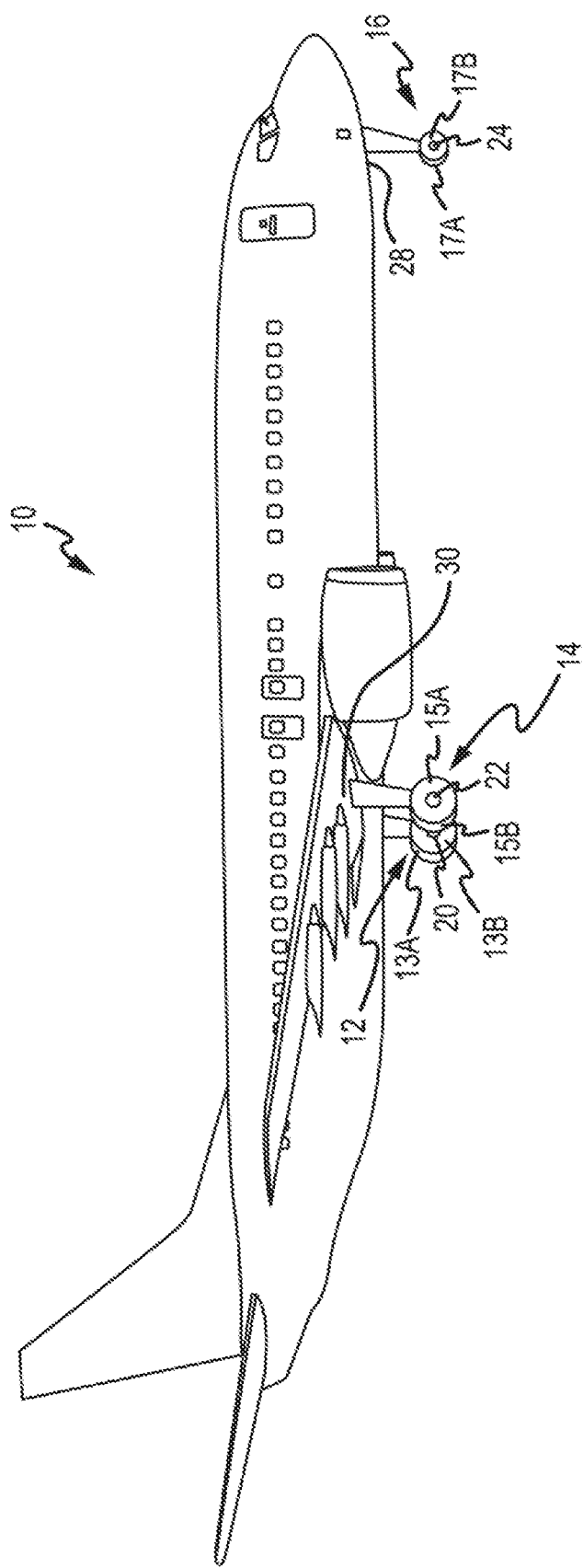
FIG. 1-A

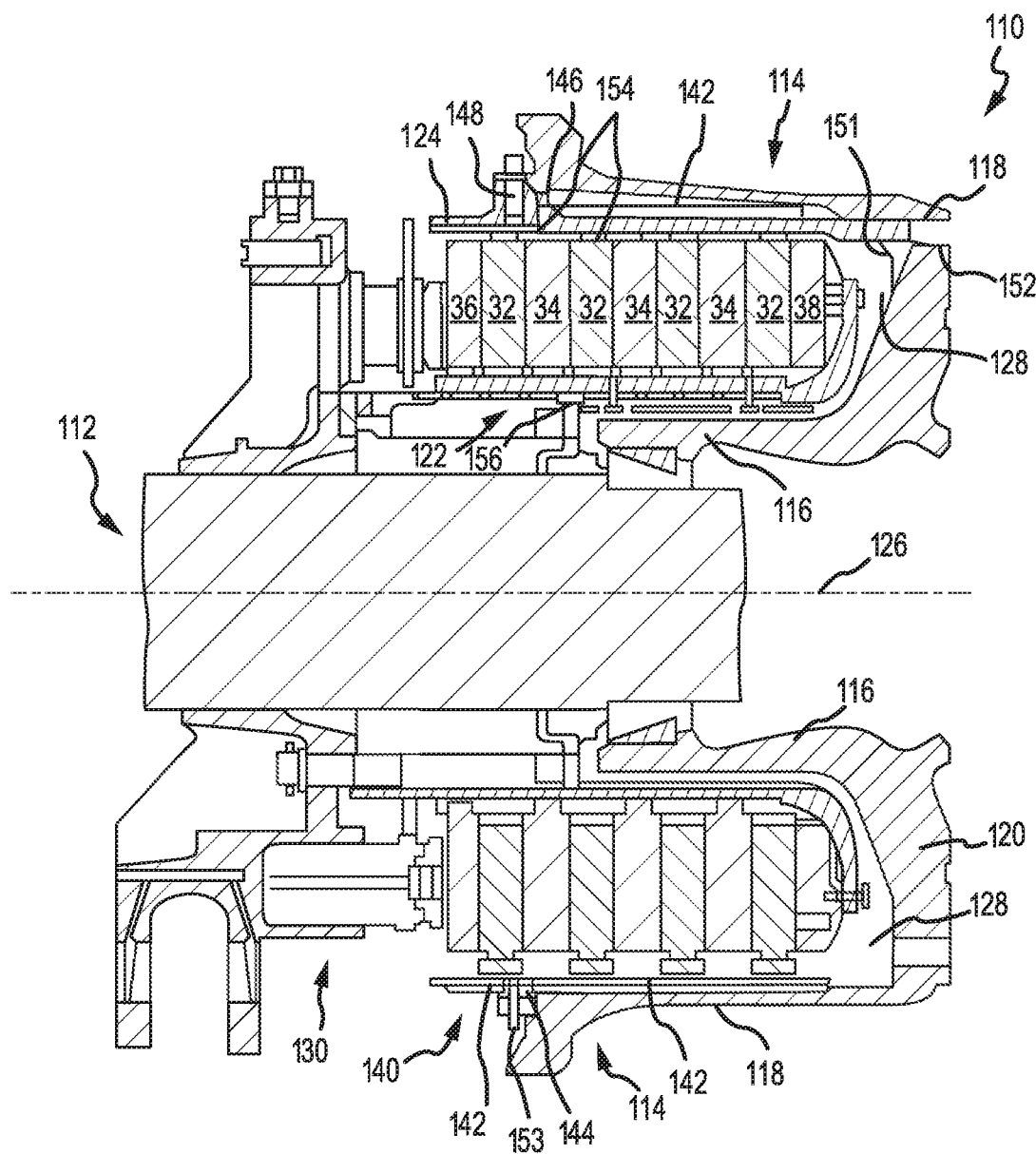
FIG. 1-B

MITIGATING PYROPHORIC DEPOSITS IN EXHAUST PIPING DURING SIC CVI/CVD PROCESSES BY INTRODUCING WATER VAPOR INTO AN OUTLET PORTION OF A REACTION CHAMBER

FIELD

The present disclosure relates to composite manufacturing, and more specifically, to ceramic matrix composite manufacturing systems and methods that inhibit the formation of various byproducts that result from such manufacturing.

BACKGROUND

Various carbon/carbon (C/C) composites are used in the aerospace industry for aircraft brake heat sink materials, among other applications. Silicon carbide (SiC) based ceramic matrix composites (CMCs) have been used as brake materials and as other components in automotive and locomotive industries. These composites are typically produced using, for example, chemical vapor infiltration (CVI) and/or chemical vapor deposition (CVD). Such processes generally include placing porous preforms into a reaction chamber and introducing a gaseous precursor to form SiC deposits within the pores of the preform.

However, conventional SiC CVI and CVD processes result in byproduct deposits accumulating within various components of the manufacturing system, such as the exhaust piping. In general, these deposits are primarily composed of polychlorosilane and/or cyclic carbosilanes that can result from several intermediate species in a CVI or CVD furnace. These deposits may be reactive, and even pyrophoric. As a result, precautions are warranted to promote a safe manufacturing environment. For example, conventional manufacturing systems are often shut down for periods of time while users manually clean the components and piping of the manufacturing system to remove these byproduct deposits. This cleaning procedure increases the downtime of the manufacturing system and thus decreases the capacity and throughput of conventional CMC manufacturing systems.

SUMMARY

In various embodiments, a system for manufacturing a ceramic matrix composite component includes a reaction chamber having an inlet portion configured to receive a porous preform and an outlet portion configured to define a gas mixing space; an exhaust conduit in fluid communication with the outlet portion of the reaction chamber; and a source of a mitigation agent in fluid communication with and downstream of the exhaust conduit.

In various embodiments: the source of the mitigation agent is configured to deliver water vapor to the exhaust conduit; and/or the source of the mitigation agent is configured to deliver ammonia to the exhaust conduit; and/or the source of the mitigation agent is configured to deliver the mitigation agent to the exhaust conduit to control chemical reactions within the exhaust conduit; and/or the source of the mitigation agent is configured to deliver the mitigation agent to the exhaust conduit to control chemical reactions of an intermediate chemical species within the exhaust conduit; and/or the source of the mitigation agent is configured to deliver the mitigation agent to the exhaust conduit to decrease a flammability of polychlorosilane within the exhaust conduit; and/or the system further includes a mass flow controller configured to control the mitigation agent delivered to the exhaust conduit; and/or the mass flow controller is configured to control at least one of an amount, pressure, temperature, and timing of the mitigation agent delivered to the exhaust conduits.

In various embodiments, a method for manufacturing a ceramic matrix composite component includes introducing a gaseous precursor into an inlet portion of a reaction chamber, the reaction chamber having an outlet portion that is downstream of the inlet portion; and delivering a mitigation agent into an exhaust conduit in fluid communication with and downstream of the outlet portion of the reaction chamber.

In various embodiments: delivering the mitigation agent into the exhaust conduit comprises controlling chemical reactions within the exhaust conduit; and/or controlling the chemical reactions within the exhaust conduit comprises controlling an intermediate chemical species within the exhaust conduit; and/or controlling the intermediate species within the exhaust conduit comprises decreasing a flammability of polychlorosilane within the exhaust conduit; and/or delivering the mitigation agent into the exhaust conduit comprises controlling at least one of an amount, pressure, temperature, and timing of the mitigation agent delivered to the exhaust conduit; and/or delivering the mitigation agent into the exhaust conduit comprises delivering water vapor into the exhaust conduit; and/or delivering the mitigation agent into the exhaust conduit comprises delivering ammonia into the exhaust conduit.

In various embodiments, a method of mitigating harmful byproducts in exhaust piping during ceramic matrix composite manufacturing includes delivering a mitigation agent into an exhaust conduit downstream of a furnace having a chamber comprising an inlet portion configured to receive a porous preform and an outlet portion configured to define a gas mixing space; and controlling the mitigation agent to control chemical reactions within the exhaust conduit.

In various embodiments: delivering the mitigation agent into the exhaust conduit comprises delivering water vapor into the exhaust conduit; and/or delivering the mitigation agent into the exhaust conduit comprises delivering ammonia into the exhaust conduit; and/or controlling the mitigation agent comprises controlling at least one of an amount, pressure, temperature, and timing of the mitigation agent delivered to the exhaust conduit.

BRIEF DESCRIPTION OF THE DRAWINGS

The accompanying drawings illustrate various embodiments employing the principles described herein and are a part of the specification. The illustrated embodiments are meant for description and do not limit the scope of the claims, and in which:

FIG. 1-A illustrates an aircraft having a brake system, in accordance with various embodiments;

FIG. 1-B illustrates a cross-sectional view of a brake assembly, in accordance with various embodiments;

DETAILED DESCRIPTION

Figure 2:
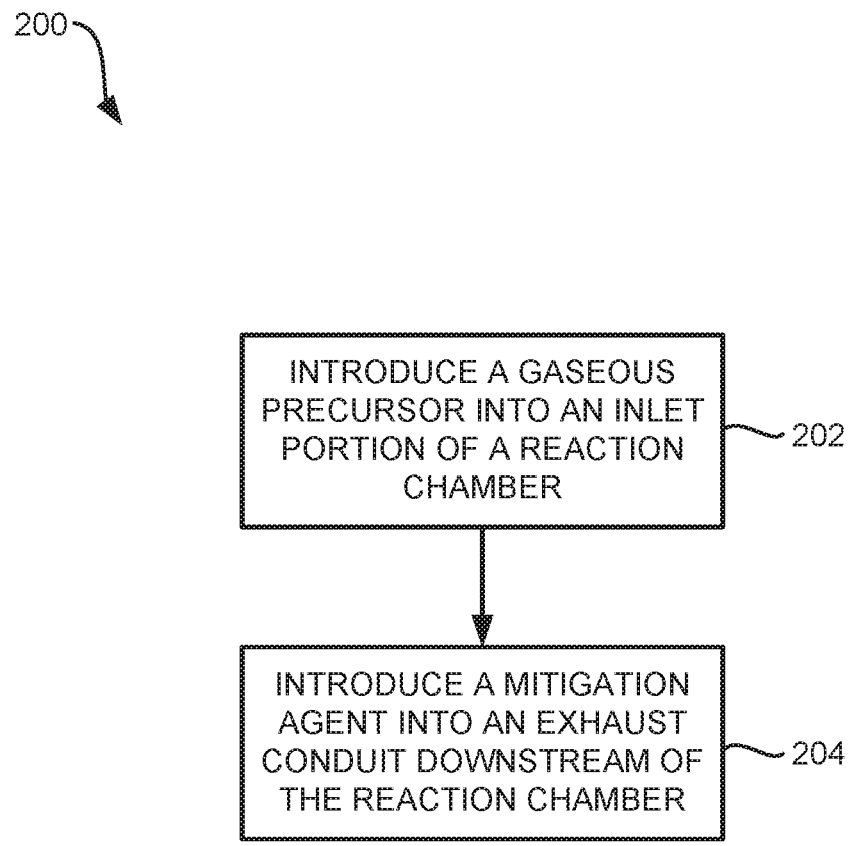
FIG. 2 is a flow chart diagram of a method of manufacturing a ceramic matrix composite (CMC), in accordance with various embodiments.

The detailed description of exemplary embodiments herein makes reference to the accompanying drawings, which show exemplary embodiments by way of illustration. While these exemplary embodiments are described in sufficient detail to enable those skilled in the art to practice the disclosure, it should be understood that other embodiments may be realized and that logical changes and adaptations in design and construction may be made in accordance with this disclosure and the teachings herein without departing from the spirit and scope of the disclosure. Thus, the detailed description herein is presented for purposes of illustration only and not of limitation.

Provided herein, according to various embodiments, are manufacturing systems and methods for fabricating ceramic matrix composites (CMC) while mitigating the formation and accumulation of harmful/hazardous byproduct deposits. While numerous details are included herein pertaining to aircraft components, such as brake components, the manufacturing systems and methods disclosed herein can be applied to fabricate other CMC components.

Referring now to FIG. 1-A, in accordance with various embodiments, an aircraft 10 includes landing gear, such as a left main landing gear 12, a right main landing gear 14, and nose landing gear 16. The left main landing gear 12, right main landing gear 14, and nose landing gear 16 typically support the aircraft 10 when the aircraft 10 is not flying, thereby allowing the aircraft 10 to taxi, take off, and land without damage. In various embodiments, the left main landing gear 12 includes a first wheel 13A and a second wheel 13B coupled by an axle 20. In various embodiments, the right main landing gear 14 includes a first wheel 15A and a second wheel 15B coupled by an axle 22. In various embodiments, the nose landing gear 16 includes a first nose wheel 17A and a second nose wheel 17B coupled by an axle 24. In various embodiments, the aircraft 10 comprises any number of landing gear(s), and each landing gear comprises any number of wheels. In various embodiments, the left main landing gear 12, right main landing gear 14, and nose landing gear 16 are retracted when the aircraft 10 is in flight. In various embodiments, one or more of the left main landing gear 12, right main landing gear 14, and nose landing gear 16 extends from an underside of a fuselage 28 of the aircraft 10, or from an underside of the wings 30 thereof.

In various embodiments, the aircraft 10 also includes a brake system that is applied to one or more of the wheels 13A, 13B, 15A, 15B, 17A, 17B of one or more of the respective left main landing gear 12, right main landing gear 14, and/or nose landing gear 16. Such brake systems of the aircraft 10 typically comprise a collection of assemblies, subsystems, and/or units that produce output signals for controlling the braking force and/or torque applied at one or more of the wheels 13A, 13B, 15A, 15B, 17A, 17B. Such brake systems typically communicate with the brakes of the left main landing gear 12, right main landing gear 14, and/or nose landing gear 16, and each brake is typically mounted to each wheel 13A, 13B, 15A, 15B, 17A, 17B in order to apply and release braking forces thereon. In various embodiments, the brakes of the aircraft 10 further include a non-rotatable wheel support, the wheels 13A, 13B, 15A, 15B, 17A, 17B mounted to the wheel support for rotation, and a brake disk stack.

Referring now to FIG. 1-B, a brake assembly 110 is located on the aircraft 10 of FIG. 1-A, in accordance with various embodiments. The brake assembly 110 typically comprises a bogie axle 112, a wheel 114 (e.g., the wheels 13A, 13B, 15A, 15B, 17A, 17B of FIG. 1-A) including a hub 116 and wheel well 118, a web 120, a torque take-out assembly 122, one or more torque bars 124, a wheel rotational axis 126, a wheel well recess 128, an actuator 130, multiple brake rotors 32, multiple brake stators 34, a pressure plate 36, an end plate 38, a heat shield 140, multiple heat shield sections 142, multiple heat shield carriers 144, an air gap 146, multiple torque bar bolts 148, a torque bar pin 151, a wheel web hole 152, multiple heat shield fasteners 153, multiple rotor lugs 154, and multiple stator slots 156.

Brake disks (e.g., the interleaved brake rotors 32 and brake stators 34) are disposed in the wheel well recess 128 of the wheel well 118. The brake rotors 32 are typically secured to the torque bars 124 for rotating with the wheel 114, while the brake stators 34 are typically engaged with the torque take-out assembly 122. At least one actuator 130 is typically operable to compress the interleaved brake rotors 32 and brake stators 34 for stopping the aircraft 10 of FIG. 1-A. In the embodiment of FIG. 1-B, the actuator 130 is shown as a hydraulically actuated piston. The pressure plate 36 and end plate 38 are disposed at opposite ends of the interleaved brake rotors 32 and brake stators 34.

Through compression of the brake rotors 32 and brake stators 34 between the pressure plate 36 and end plate 38, the resulting frictional contact slows, stops, and/or prevents rotation of the wheel 114. The torque take-out assembly 122 is typically secured to a stationary portion of a landing gear truck, such as a bogie beam or other landing gear strut, such that the torque take-out assembly 122 and brake stators 34 are prevented from rotating during braking of the aircraft 10 of FIG. 1-A. The brake rotors 32 and brake stators 34 are typically fabricated from various materials, such as ceramic matrix composites (CMCs). The brake disks typically withstand and dissipate the heat generated from contact between the brake disks while braking the aircraft 10 of FIG. 1-A.

Referring now to FIG. 2, and in various embodiments, a method 200 of manufacturing a CMC component, such as a brake disk, is provided. In various embodiments, the method 200 includes utilizing an apparatus and manufacturing system 305, 400 as disclosed herein, such as shown in FIGS. 3-4, respectively.

Figure 3:
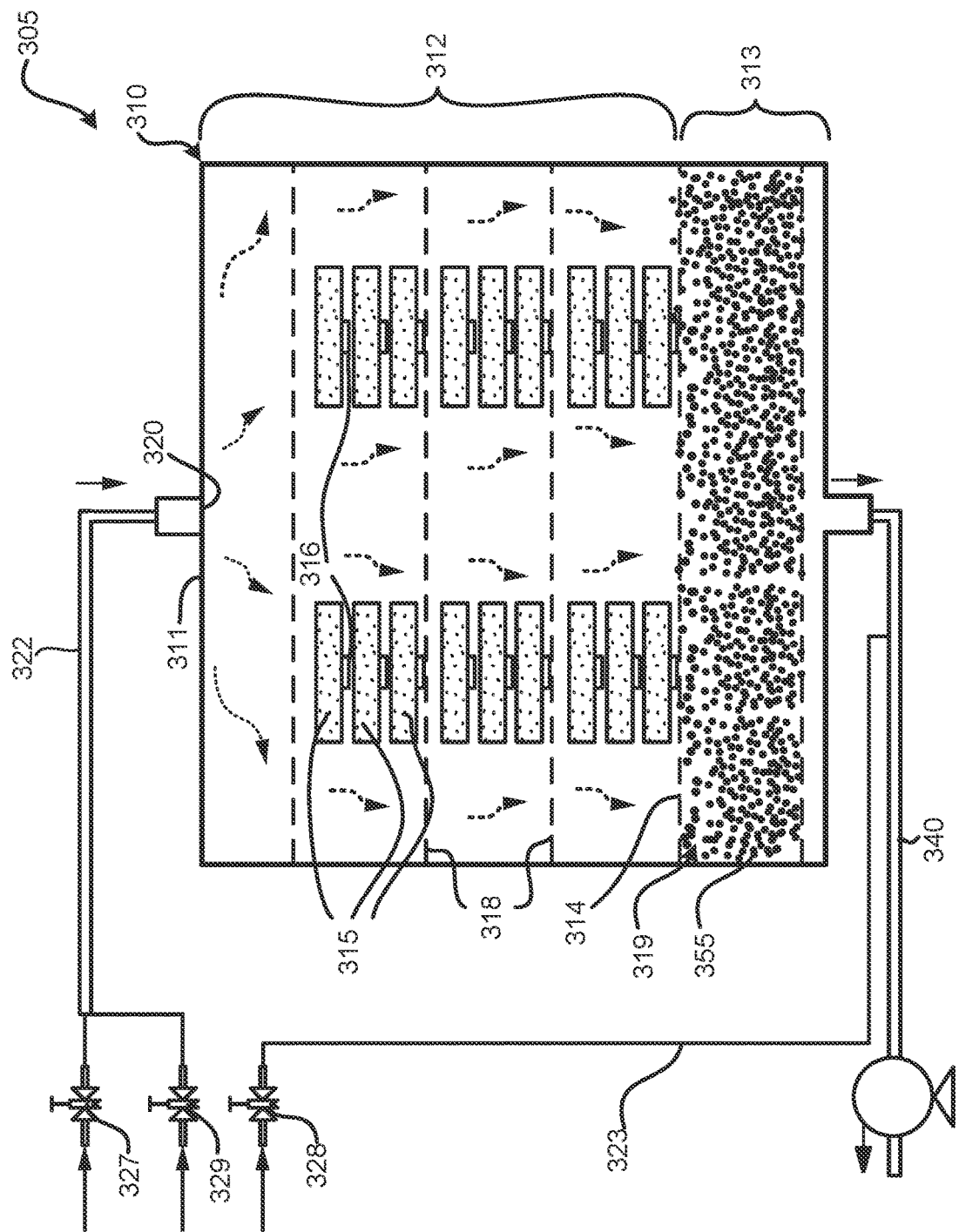
FIG. 3 is a schematic view of a CMC manufacturing system, in accordance with various embodiments.
Figure 4:
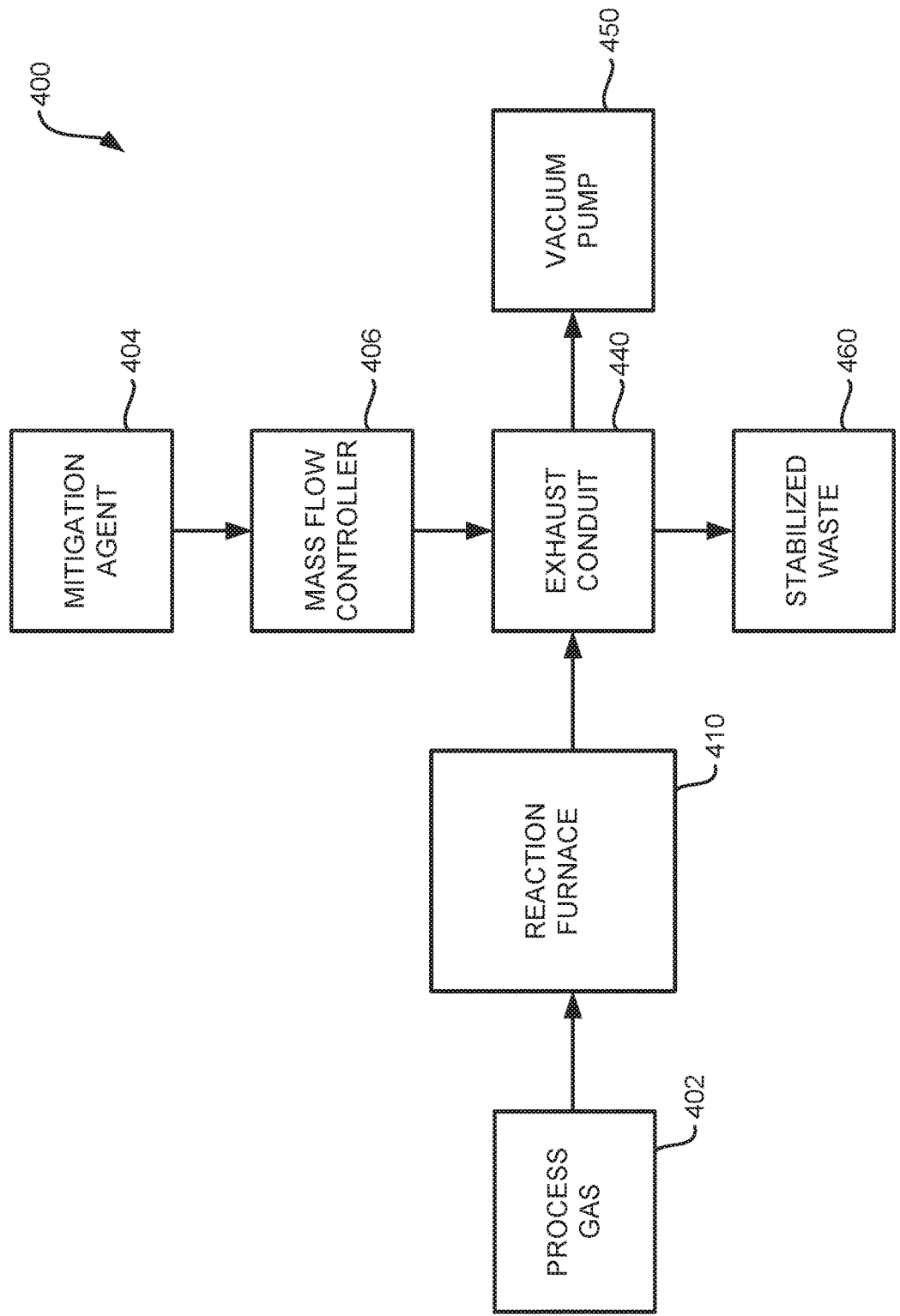
FIG. 4 is a simplified view of a CMC manufacturing system, in accordance with various embodiments.

In various embodiments, and with various reference to FIGS. 2-4, the method 200 of FIG. 2 includes introducing a gaseous precursor into an inlet portion 312 of a reaction chamber 310 at a step 202, followed by introducing a mitigation agent, such as water vapor or ammonia, into an exhaust conduit 340 downstream of an outlet portion 313 of the reaction chamber 310 at step a 204. One or more porous preforms 315, typically made from carbon or silicon carbide (SiC) fibers, are loaded into the inlet portion 312 of the reaction chamber 310, which typically is a reactor furnace or other reaction compartment. Generally, introducing the gaseous precursor at step 202 results in densification of the porous preforms 315, and introducing the mitigation agent at step 204 reacts with flammable intermediate species to produce less flammable byproducts, thus mitigating the formation of harmful and/or pyrophoric deposits, which can accumulate in the exhaust conduit 340 that is coupled in fluid communication with, and downstream from, the outlet portion 313 of the reaction chamber 310, as described herein.

In various embodiments, the gaseous precursor of step 202 is introduced via an inlet 320 into the inlet portion 312 of the reaction chamber 310, and the mitigation agent of step 204 is introduced into the exhaust conduit 340 downstream of the outlet portion 313 of the reaction chamber 310. In various embodiments, step 202 and step 204 are performed simultaneously to fabricate CMC components. In other words, the gaseous precursor of step 202 flows into the inlet portion 312 of the reaction chamber 310 at or about at the same time (e.g., in various embodiments, at the same time; within other embodiments, within several seconds of one another; within other embodiments, within several minutes of one another) that the mitigation agent of step 204 flows into the exhaust conduit 340 downstream of the reaction chamber 310 during various embodiments of CMC fabrication. Accordingly, in various embodiments, the inlet portion 312 of the reaction chamber 310 is upstream of the outlet portion 313 of the reaction chamber 310. The inlet portion 312 is proximate where the porous preforms 315 are loaded into the reaction chamber 310. The outlet portion 313 is distal from the inlet portion 312, proximate the exhaust conduit 340, and the exhaust conduit 340 is downstream of the reaction chamber 310. The inlet portion 312 and outlet portion 313 are spaced apart from one another within the reaction chamber 310, the inlet portion 312 and outlet portion 313 generally defining the reaction chamber 310 from opposing ends thereof. The inlet portion 312 is distal from the exhaust conduit 340, and the outlet portion 313 is distal from where the porous preforms 315 enter the reaction chamber 310.

In various embodiments, the gaseous precursor of step 202 is introduced via the inlet 320 at an inlet upstream side 311 of the inlet portion 312 of the reaction chamber 310, and the mitigation agent of step 204 is introduced into the exhaust conduit 340 downstream of the outlet portion 313 of the reaction chamber 310. In various embodiments, because the mitigation agent is introduced into the exhaust conduit 340 downstream of the outlet portion 313 of the reaction chamber 310, the mitigation agent does not interact with the porous preforms 315, and it thus does not directly affect the reaction chemistry, as described herein, at least not in the inlet portion 312 or outlet portion 313 of the reaction chamber 310. Instead, the mitigation agent reacts with a species in the effluent gas flowing from the inlet portion 312 and/or outlet portion 313 of the reaction chamber 310 to inhibit and/or mitigate the formation of reactive and/or pyrophoric byproduct deposits in the exhaust conduit 340 downstream of the reaction chamber 310, according to various embodiments.

In various embodiments, the mitigation agent is water and/or water vapor. In various embodiments, the mitigation agent is ammonia.

In various embodiments, the flow rates of the gaseous precursor and the mitigation agent are different. Introducing the gaseous precursor at step 202 in FIG. 2 is performed at a first flow rate (e.g., a first molar flow rate of gaseous precursor), and introducing the mitigation agent at step 204 in FIG. 2 is performed at a second flow rate (e.g., a second molar flow rate or water vapor per unit of time). In various embodiments, the second molar flow rate of the mitigation agent is between about 50% and about 300% higher than the first molar flow rate of the gaseous precursor. In various embodiments, the second molar flow rate of the mitigation agent is between about 100% and about 200% higher than the first molar flow rate of the gaseous precursor. In various embodiments, the method 200 of FIG. 2 includes controlling the temperature and pressure within the reaction chamber 310 to specific values. For example, in various embodiments, the method 200 includes heating the reaction chamber 310 to above 1,000 degrees Celsius and/or maintaining the reaction chamber 310 at 10 torr (1.33 kilopascal).

In various embodiments, the gaseous precursor includes one or more reactants/reagents that react within the inlet portion 312 of the reaction chamber 310 and infiltrate the pores of the porous preforms 315 to densify the porous preforms 315. For example, the gaseous precursor includes, in various embodiments, methyltrichlorosilane (MTS), dimethyldichlorosilane, or trimethylchlorosilane, among others. In various embodiments, the MTS decomposes in response to being introduced via the inlet 320 into the inlet portion 312 of the reaction chamber 310 and, via various intermediate reactions, results in SiC deposits forming inside the pores of the porous preforms 315. Additional details pertaining to illustrative reactions that occur during the chemical vapor infiltration (CVI) and/or chemical vapor deposition (CVD) processes are included herein. In various embodiments, the gaseous precursor also includes hydrogen gas. In various embodiments, the MTS constitutes about 5% of the gaseous precursor.

In various embodiments, the reaction pathway that occurs within the reaction chamber 310, with MTS and hydrogen gas constituting the gaseous precursor, includes the following chemical reactions:

$$CH_3SiCl_3 \rightarrow \cdot SiCl_3 + \cdot CH_3 \qquad \text{Equation (1)}$$

$$\cdot SiCl_3 + \cdot CH_3 \rightarrow SiC + 3HCl \qquad \text{Equation (2)}$$

$$\cdot CH_3 + H_2 \rightarrow CH_4 + \cdot H \qquad \text{Equation (3)}$$

$$\cdot SiCl_3 + CH_3SiCl_3 \rightarrow HSiCl_3 + Cl_3SiCH_2\cdot \qquad \text{Equation (4)}$$

$$CH_3SiCl_3 \rightarrow Cl_2Si{=}CH_2 + HCl \qquad \text{Equation (5)}$$

$$HSiCl_3 \rightarrow {:}SiCl_2 + HCl \qquad \text{Equation (6)}$$

$$CH_3SiCl_3 \rightarrow ClCH_3 + {:}SiCl_2 \qquad \text{Equation (7)}$$

$${:}SiCl_2 + CH_4 \rightarrow {:}ClSiCH_3 + HCl \qquad \text{Equation (8)}$$

$$ClCH_3 + H_2 \rightarrow CH_4 + HCl \qquad \text{Equation (9)}$$

In various embodiments, the mitigation agent, e.g., water vapor and/or ammonia, reacts with more flammable intermediate species to produce less flammable byproducts, thus mitigating the formation of harmful and/or pyrophoric deposits in the exhaust conduit 340. That is, the mitigation agent alters the stoichiometric ratios of the various/intermediate reactions to mitigate the formation of harmful byproducts that can accumulate within the exhaust conduit 340 of the apparatus and manufacturing system 305, 400.

In various embodiments, further modification(s) to the SiC CVI and/or CVD exhaust and byproduct management system further mitigate(s) the formation of the harmful and/or pyrophoric deposits in the exhaust conduit 340. Specifically, adding water vapor and/or ammonia as the mitigation agent into the exhaust conduit 340 converts more flammable and/or pyrophoric intermediate species to less reactive and/or pyrophoric byproducts by chemical reactions occurring in the exhaust conduit 340. Accordingly, while the intermediate species can be chlorosilanes or chlorinated carbosilanes, chlorine in the intermediate species is replaced with hydroxyl groups when reacted with water. As an example, the species, $HSiCl_3$, is shown here:

$$HSiCl_3 + 3H_2O = HSi(OH)_3 + 3HCl \qquad \text{Equation (10)}$$

As a result, the flammability or reactivity of the $HSi(OH)_3$ is much less than that of the HSiCl3 and intermediate species. The flammability of the newly-formed byproducts is reduced and pyrophoric deposits are thereby mitigated.

The water vapor and/or ammonia, as the mitigation agent, react with the more flammable intermediate species before they accumulate, deposit, and form within the exhaust conduit 340. The water vapor forms silanol compounds that are less flammable and reactive, particularly as compared to otherwise pyrophoric deposits within the exhaust conduit 340.

While numerous details are included herein pertaining specifically to using MTS as the gaseous precursor, other compounds are utilized in various embodiments. For example, in various embodiments, the gaseous precursors are dimethyldichlorosilane or trimethylchlorosilane, among others. In various embodiments, the mitigation agent includes water, water vapor, and/or ammonia.

Referring further to FIG. 3, and in various embodiments, the apparatus and manufacturing system 305 is a chemical vapor deposition (CVD) apparatus and includes a first supply conduit 322 and a second supply conduit 323. In various embodiments, the first supply conduit 322 delivers the gaseous precursor from a source to the inlet portion 312 of the reaction chamber 310 via the inlet 320. In various embodiments, the second supply conduit 323 delivers the mitigation agent from a source to the exhaust conduit 340 downstream of the outlet portion 313 of the reaction chamber 310. In various embodiments, a first valve 327 is coupled to the first supply conduit 322 to control flow of the gaseous precursor. In various embodiments, a second valve 328 is coupled to the second supply conduit 323 to control flow of the mitigation agent. In various embodiments, the apparatus and manufacturing system 305 also includes a purge valve 329 that is configured to control flow of a purge gas through the first supply conduit 322 for purging the reaction chamber 310 after a completed CVD process.

In various embodiments, the second supply conduit 323 delivers the mitigation agent to the exhaust conduit 340 downstream of the outlet portion 313 of the reaction chamber 310. That is, in various embodiments, the second supply conduit 323 and the mitigation agent are external to the reaction chamber 310. In various embodiments, the second supply conduit 323 is disposed adjacent to and/or in a side wall of the reaction chamber 310, located distal the inlet portion 312 of the reaction chamber 310 and in fluid communication with the exhaust conduit 340 downstream of the reaction chamber 310.

In various embodiments, the inlet portion 312 of the reaction chamber 310 includes one or more retention spacers 316 for retaining one or more of the porous preforms 315. In various embodiments, the retention spacers 316 facilitate distributing the porous preforms 315 throughout the inlet portion 312 of the reaction chamber 310. In various embodiments, the retention spacers 316 are porous themselves, thus further allowing sufficient CVI and/or CVD. In various embodiments, the reaction chamber 310 includes one or more gas distributors 318 that facilitate the mixing and distribution of the gaseous precursor flowing through the porous preforms 315. In various embodiments, the gas distributors 318 divide the inlet portion 312 into sub-compartments.

In various embodiments, the outlet portion 313 of the reaction chamber 310 defines a gas mixing space 319 that is configured to house a gas mixing distributor (e.g., a reaction sub-chamber). In various embodiments, the gas mixing space 319 facilitates mixing of the effluent gas from the inlet portion 312. In various embodiments, the gas mixing space 319 also includes a porous substrate. In various embodiments, the gas mixing space 319 is loaded with a gas mixing substrate 355, such as volcanic rock or graphite, among other materials, the gas mixing space 319 being contained within the outlet portion 313 of the reaction chamber 310 and apart from the inlet portion 312 of the reaction chamber 310.

Referring now to FIG. 4, a simplified CMC manufacturing system 400 includes feeding a process gas from a process gas source 402 into a reaction furnace 410, such as the CVD or CVI furnace described in reference to FIG. 3. A mitigation agent source 404 communicates with a mass flow controller 406 to control the mitigation agent delivered from the mitigation agent source 404 to an exhaust conduit 440 that is connected to and downstream of the reaction furnace 410. The mass flow controller 406 delivers the mitigation agent from the mitigation agent source 404 to the exhaust conduit 440. In various embodiments, the mass flow controller 406 controls and monitors at least one or more of the amount, pressure, temperature, and/or timing of the mitigation agent delivered to the exhaust conduit 440. In various embodiments, a stabilized waste receiver 460 receives the stabilized waste discharged from the exhaust conduit 440, the exhaust stream aided by a vacuum pump 450 in communication with the exhaust conduit 440. In various embodiments, the mitigation agent—e.g., the water vapor and/or ammonia—interacts with byproducts in the exhaust conduit 440, but not within the reaction furnace 410, as described.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure.

The scope of the disclosure is accordingly to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. All ranges and ratio limits disclosed herein may be combined.

Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B, and C may be present in a single embodiment; for example, A and B, A and C, B and C, or A and B and C. Different cross-hatching is used throughout the figures to denote different parts, but not necessarily to denote the same or different materials.

The steps recited in any of the method or process descriptions may be executed in any order and are not necessarily limited to the order presented. Furthermore, any reference to singular includes plural embodiments, and any reference to more than one component or step may include a singular embodiment or step. Elements and steps in the figures are illustrated for simplicity and clarity and have not necessarily been rendered according to any particular sequence. For example, steps that may be performed concurrently or in different order are illustrated in the figures to help to improve understanding of embodiments of the present disclosure.

Any reference to attached, fixed, connected, or the like may include permanent, removable, temporary, partial, full and/or any other possible attachment option. Additionally, any reference to without contact (or similar phrases) may also include reduced contact or minimal contact. Surface shading lines may be used throughout the figures to denote different parts or areas, but not necessarily to denote the same or different materials. In some cases, reference coordinates may be specific to each figure.

Systems, methods, and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments, whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element is intended to invoke 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A system for manufacturing a ceramic matrix composite component, comprising:
    a reaction chamber including an inlet portion configured to receive a porous preform and a gaseous precursor, and further including an outlet portion configured to define a gas mixing space;
    an exhaust conduit in fluid communication with the outlet portion of the reaction chamber; and
    a supply conduit configured to deliver a mitigation agent to the exhaust conduit downstream of the outlet portion;
    wherein the outlet portion comprises a porous gas mixing substrate disposed downstream from the inlet portion, wherein the porous gas mixing substrate comprises one of a volcanic rock and a graphite;
    the porous preform comprises silicon carbide (SiC);
    the gaseous precursor comprises at least one of a chlorosilane, a chlorinated carbosilane, and a methyltrichlorosilane;
    the mitigating agent comprises at least one of water vapor and ammonia; and
    a chlorine in at least one of (i) the gaseous precursor and (ii) an intermediate species of the gaseous precursor is replaced with a hydroxyl group in response to being reacted with the mitigating agent.

2. The system of claim 1, wherein the mitigation agent comprises water vapor.

3. The system of claim 1, wherein the mitigation agent comprises ammonia.

4. The system of claim 1, wherein the mitigation agent is configured to control chemical reactions within the exhaust conduit.

5. The system of claim 1, wherein the mitigation agent is configured to decrease a flammability of polychlorosilane within the exhaust conduit.

6. The system of claim 1, further comprising a mass flow controller configured to control the mitigation agent delivered to the exhaust conduit.

7. The system of claim 6, wherein the mass flow controller is configured to control at least one of an amount, pressure, temperature, and timing of the mitigation agent delivered to the exhaust conduit.

8. The system of claim 1, wherein the gaseous precursor is introduced into the reaction chamber at a first flow rate, the mitigation agent is introduced into the exhaust conduit at a second flow rate, and the second flow rate is between 50% and 300% higher than the first flow rate of the gaseous precursor.

9. The system of claim 1, further comprising a vacuum pump, wherein the supply conduit configured to deliver the mitigation agent to the exhaust conduit upstream from the vacuum pump.

10. The system of claim 1, wherein the reaction chamber further includes a gas distributor configured to facilitate the mixing and distribution of the gaseous precursor flowing through the porous preform.

11. The system of claim 10, wherein the gas distributor divides the inlet portion into at least a first sub-compartment and a second sub-compartment.

* * * * *